United States Patent
Broome

(10) Patent No.: US 6,557,709 B2
(45) Date of Patent: May 6, 2003

(54) EQUIPMENT RACK ACCESSORY FOR IMPROVING EQUIPMENT MOUNTING

(75) Inventor: John P. Broome, Arlington, VA (US)

(73) Assignee: ServerVault Corp., Sterling, VA (US)

( * ) Notice: Subject to any disclaimer, the term of this patent is extended or adjusted under 35 U.S.C. 154(b) by 0 days.

(21) Appl. No.: 09/894,877

(22) Filed: Jun. 29, 2001

(65) Prior Publication Data

US 2002/0020683 A1 Feb. 21, 2002

Related U.S. Application Data

(60) Provisional application No. 60/214,746, filed on Jun. 29, 2000.

(51) Int. Cl.$^7$ .................................................. A47F 5/00
(52) U.S. Cl. ........................... 211/26; 211/183; 361/683; 312/223.2
(58) Field of Search ....................... 211/26, 26.2, 90.01, 211/90.04, 134, 153, 186, 187, 135, 190, 87.01, 40; 312/265.1, 265.6, 223.2, 223.1; 361/683, 829, 724

(56) References Cited

U.S. PATENT DOCUMENTS

| | | | |
|---|---|---|---|
| 618,551 A | 1/1899 | Winslow et al. | |
| 2,777,893 A | 1/1957 | De Rosso | |
| 3,471,029 A | * 10/1969 | Dolan | 211/26 |
| 3,731,157 A | 5/1973 | Reimer | |
| 3,863,575 A | * 2/1975 | Kuns et al. | 108/111 |
| 4,228,743 A | * 10/1980 | Crook | 108/31 |
| 4,353,469 A | 10/1982 | Etchison, Jr. et al. | |
| 4,385,781 A | 5/1983 | Welsch et al. | |
| 4,496,057 A | * 1/1985 | Zenitani et al. | 211/26 |
| 4,497,411 A | * 2/1985 | DeBortoli | 211/26 |
| 4,519,016 A | 5/1985 | Bradley et al. | |
| 4,553,674 A | 11/1985 | Yoshikawa et al. | |
| 4,641,754 A | * 2/1987 | Hebel et al. | 211/26 |
| 4,664,265 A | 5/1987 | George, Jr. | |
| 4,780,570 A | 10/1988 | Chuck | |
| 4,793,405 A | 12/1988 | Diggelmann et al. | |
| 4,821,150 A | 4/1989 | Duthie et al. | |
| 5,026,015 A | 6/1991 | Patrick | |
| 5,049,701 A | 9/1991 | Vowles et al. | |
| 5,165,770 A | 11/1992 | Hahn | |
| 5,209,356 A | * 5/1993 | Chaffee | 211/26 |
| 5,394,305 A | 2/1995 | Moral et al. | |
| 5,586,012 A | * 12/1996 | Lerman | 361/826 |
| 5,680,296 A | 10/1997 | Hileman et al. | |
| 5,691,504 A | 11/1997 | Sands et al. | |
| 5,730,515 A | 3/1998 | Ho | |
| 5,738,226 A | 4/1998 | Dean | |
| 5,748,404 A | 5/1998 | Sawada | |
| 5,912,801 A | 6/1999 | Roy et al. | |
| 5,936,835 A | * 8/1999 | Astier | 361/684 |
| 5,969,942 A | 10/1999 | Heckner et al. | |
| 6,010,015 A | * 1/2000 | Lin | 211/40 |
| 6,065,612 A | * 5/2000 | Rinderer | 211/26 |
| 6,170,784 B1 | * 1/2001 | MacDonald et al. | 248/65 |
| 6,185,899 B1 | * 2/2001 | De Niet | 52/762 |
| 6,202,570 B1 | * 3/2001 | Kurtsman | 108/108 |
| 6,223,909 B1 | * 5/2001 | Mendoza | 211/26 |
| 6,279,753 B1 | * 8/2001 | Swanson | 211/13.1 |
| 6,292,360 B1 | * 9/2001 | Carteau | 361/685 |
| 6,307,756 B1 | * 10/2001 | Liu et al. | 361/816 |

* cited by examiner

Primary Examiner—Daniel P. Stodola
Assistant Examiner—Jennifer E. Novosad
(74) Attorney, Agent, or Firm—Nixon & Vanderhye P.C.

(57) ABSTRACT

A rack accessory for an equipment rack having mounting locations for a predetermined number of units of electronic equipment within a predetermined vertical distance, including: a front support member and a rear support member, wherein the front support member defines a bracket adapted to be secured on a front mounting portion of the rack; and a predetermined number of substantially equally spaced shelves extending between the front support member and the rear support member. The shelves are each configured to support a side portion of the electronic equipment when installed in the rack. The rack accessory has a height that substantially corresponds to the predetermined vertical distance, and the predetermined number of shelves is less than the predetermined number of units.

8 Claims, 9 Drawing Sheets

EQUIPMENT RACK ACCESSORY FOR IMPROVING EQUIPMENT MOUNTING

CROSS-REFERENCES TO RELATED APPLICATIONS

This application hereby claims priority on U.S. provisional application Ser. No. 60/214,746 filed Jun. 29, 2000, and entitled "Method of Mounting 1U Data center Equipment".

This application is related to co-pending patent application Ser. No. 09/893,517 file concurrently herewith and entitled "Equipment Rack With Integral Hvac And Power Distribution Features", the disclosure of which is incorporated by reference herein in its entirety.

FIELD OF THE INVENTION

The instant invention relates to equipment racks and, more particularly, to an accessory for data center equipment racks that improves the functionality thereof. The invention has particular applicability to telecommunications equipment racks and cabinets constructed in accordance with the EIA/TIA standard EIA-310-D ("cabinets, Racks, Panels and Associated Equipment" (ANSI/EIA/310-D-92)).

BACKGROUND OF THE INVENTION

Data center processing equipment, such as telecommunications equipment, servers and the like, are typically mounted in racks or cabinets within a data center. Data center processing equipment has been getting smaller over the years. For example, machines with the same amount of computing power that used to measure six or more inches in height are now contained in 1.75 inches.

The size and shape of such processing equipment has become fairly standardized. The structure of racks and cabinets for use in mounting the processing equipment has also become fairly standardized is several respects. For example, in traditional computer rooms and data communication facilities, racks are typically provided that have the following common characteristics:

19 inch or 23 inch width (nominal);

2 rail or four post designs;

varying depth of 4 post racks or cabinets; and mounting systems to accommodate equipment in height multiples of 1.75 inches (one "rack unit"), typically pre-drilled and tapped holes for screw-mounting equipment.

These common characteristics are defined in EIA/TIA standard EIA-310-D ("cabinets, Racks, Panels and Associated Equipment" (ANSI/EIA/310-D-92)).

In view of this accepted standard for racks, cabinets and equipment, there are a substantial number of processing machines, such as servers for use in connection with the Internet, that are 1.75 inches in height. Such equipment is known as "1U equipment". In conventional rack mounting systems, 1.75 inches is known as "one rack unit", or the smallest unit of measure for equipment mounting locations within the vertical space of one data rack. This height (1U) corresponds to the standard mounting distance in EIA-spec telecommunications racks, and is the smallest unit of measure when discussing data center footprint of computing machines.

EIA-spec telecommunications racks and the like include predefined screw holes in the frame of the rack for enabling 1U equipment to be mounted thereon in a stacked manner. The mounting holes in such EIA-spec racks are positioned such that, when mounted, each piece of equipment is in contact, or very close to being in contact, with adjacent pieces of equipment. In other words, such EIA-spec racks are designed such that there is substantially no space between each piece of equipment.

There are several problems associated with the use of EIA-spec telecommunications racks, and other similar racks. For example, when 1U equipment is mounted vertically with no space between adjacent pieces of equipment, there is a substantial amount of heat conducted up the stack of equipment from one machine to another. This phenomenon is known as the "chimney effect." Most of this heat energy is conducted up through the stacked equipment due to the proximity of the equipment cases (touching or very nearly touching). As a result, data centers that house such racks must constantly provide sufficient cooling for the equipment to prevent damage or malfunction of the equipment due to this excess heat.

In addition, traditional mounting and unmounting of 1U equipment is difficult. For example, if the equipment provides for rail attachments at the front only (2 rail design) or in the front and rear (four post design), the equipment must be supported (typically by hand) while the fasteners are attached. In a dense rack, i.e., a rack with lots of equipment already mounted therein, it can be difficult to support the equipment while fastening the equipment to the rack. Moreover, if the equipment does not provide for rear attachment or other support, then there is significant stress placed on the front mounting brackets. For example, a bracket that is less than or equal to 1.75 inches in height must support the moment caused from the equipment weight centered (in some cases substantially) behind the mounting point. This stress can damage equipment cases and/or components therein.

As explained above, some of the main problems with existing mounting systems, such as EIA-spec mounting systems and the like, can be summarized as follows:

When multiple units of equipment are mounted in a vertically stacked manner, heat is conducted between adjacent units and heat is radiated upwardly from unit to unit. This can cause particular heating problems for units mounted closer to the top of the rack;

Smaller one Rack Unit (1U) high pieces of equipment suffer from high moment on their front mounting brackets when not also supported in the rear, thereby causing stress on the equipment and the rack; and In dense racks, it is difficult to support the equipment while fastening the equipment to the rack.

Thus, improvements in equipment mounting systems are needed to overcome the above-described problems with conventional mounting systems. The instant invention is designed to overcome these and other problems with conventional mounting systems by providing an accessory that can easily and effectively be mounted on an EIA-spec rack for the purpose of enabling the equipment to be mounted or supported on the accessory rather than directly on the rack. In other words, the invention provides a rack accessory that is mounted on the rack prior to mounting equipment in the rack. The accessory is designed to reduce the heat problems, mounting problems and stress problems described above.

In accordance with one aspect of the invention, a rack accessory is provided for an equipment rack having mounting locations for a predetermined number of units of electronic equipment within a predetermined vertical distance. The rack includes a front support member and a rear support member, wherein the front support member defines a bracket adapted to be secured on a front mounting portion of the rack. The rack accessory further includes a predetermined number of substantially parallel and substantially equally spaced shelves extending between the front support member and the rear support member. The shelves are each configured to support a side portion of the electronic equipment when installed in the rack. In accordance with a primary feature of the present invention, the rack accessory has a height that substantially corresponds to the predetermined vertical distance, and the predetermined number of shelves is less than the predetermined number of units for which the rack is designed to accommodate within the predetermined vertical distance.

In accordance with another aspect of the invention, a method is provided for mounting electronic equipment in an equipment rack, wherein the rack includes mounting locations for a predetermined number of units of electronic equipment within a predetermined vertical distance. The method includes providing a first rack accessory including: a front support member and a rear support member, wherein the front support member defines a bracket adapted to be secured on a front mounting portion of the rack; and a predetermined number of substantially parallel and substantially equally spaced shelves extending between the front support member and the rear support member, wherein the shelves are each configured to support a side portion of a respective one of the units of electronic equipment when installed in the rack; wherein the rack accessory has a height that substantially corresponds to the predetermined vertical distance, and the predetermined number of shelves is less than the predetermined number of units. The method further includes providing a second rack accessory similar to the first rack accessory and having a reverse configuration relative to the first rack accessory, mounting the front support member of the first rack accessory on a first side of a front portion of the rack such that the shelves extend inwardly; mounting the front support member of the second rack accessory on a second side of a front portion of the rack such that the shelves extend inwardly, and such that the second rack accessory substantially corresponds to a vertical location on the rack at which the first rack accessory is mounted; and installing at least one piece of electronic equipment in the rack such that respective side portions of the equipment are supported on respective shelves of the first rack accessory and the second rack accessory.

In a preferred embodiment, the rack accessory of the instant invention is designed for use in connection with racks corresponding to the EIA/TIA standard EIA-310-D ("cabinets, Racks, Panels and Associated Equipment" (ANSI/EIA/310-D-92)) and for use with equipment, such as Web servers and the like, that are one Rack Unit (1U) in height.

As will be seen from the description of the invention herein, the rack accessory of the instant invention provides at least the following main improvements over conventional rack systems:

Equipment is supported along its entire depth, thereby eliminating the moment on the front mounting bracket and preventing stress on equipment cases and components;

A single technician can mount servers and other similar equipment very easily and quickly; and The invention introduces a small air gap between the mounted equipment, which breaks the heat conduction path and allows cooling air to be distributed between machines.

BRIEF DESCRIPTION OF THE DRAWINGS

These and other objects, features and advantages of the instant invention will become apparent from the following detailed description of the invention when read in conjunction with the appended drawings, in which.

DETAILED DESCRIPTION OF THE PREFERRED EMBODIMENTS

The preferred embodiments of the instant invention will now be described with reference to the drawings. The particular embodiments described and illustrated herein are only exemplary and are not meant to limit the scope of the invention to the particular embodiments except as otherwise indicated in the appended claims.

Figure 1:
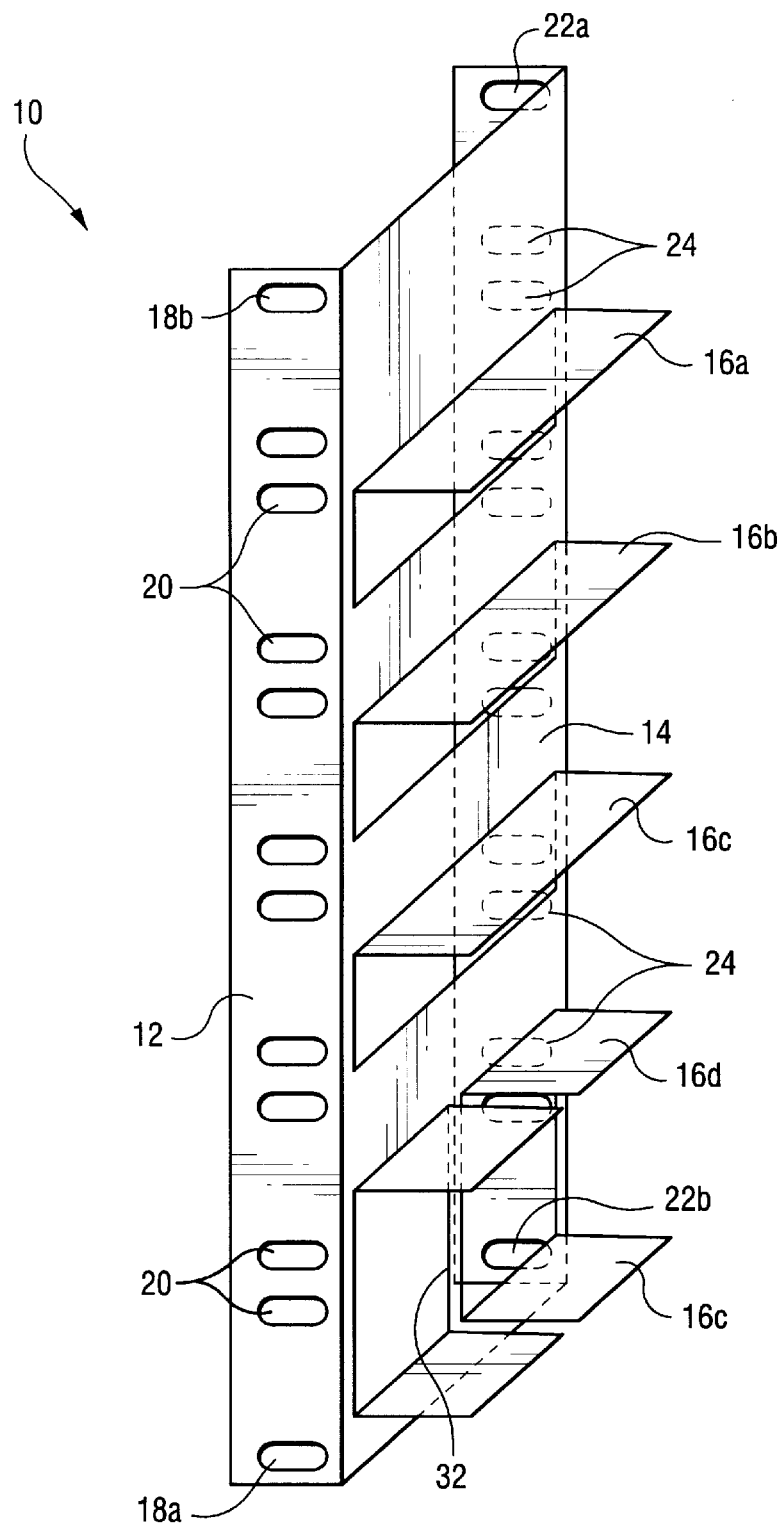
FIG. 1 is a perspective view of a preferred embodiment of the rack accessory of the instant invention.

Referring now to FIG. 1, an embodiment of the rack accessory 10 of the instant invention includes a front support member 12 and a rear support member 14. A plurality of shelves 16a–16e extend between the front and back support members 12 and 14. The shelves 16a–16e are preferably substantially parallel to one another and are substantially equally spaced in the vertical direction from one another. As will be explained in greater detail below, the shelves 16a–16e are designed to support at least a portion of the side portions of servers or other electronic equipment when installed in an equipment rack having the rack accessory 10 of the instant invention mounted therein.

In accordance with the invention, the rack accessory 10 may be any suitable size and may include any suitable number of shelves, depending on the particular application in which the rack accessory is used. However, in accordance with an important aspect of the invention, the rack accessory enables less equipment to be installed in the rack in a defined vertical space as compared to the number of pieces of equipment that the rack was originally designed to accommodate within the defined vertical space.

The front support member 12 is preferably in the form of a mounting bracket and includes mounting holes, such as holes 18a and 18b, or other means of enabling the rack accessory 10 to be mounted in or installed in an existing equipment rack. Additional holes (e.g., 20) may also be provided on the front support member 12 for enabling rack accessory to be attached to the rack or for enabling the equipment to be secured to the rack accessory. The front support member 12 is preferably constructed to enable the support member/mounting bracket to be positioned on the outside of the front face of an equipment rack, such that the shelves 16a–16e extend rearwardly from the front surface of the rack. The mounting holes (e.g., 18a, 18b and/or 20) are located on the front support member 12 at locations that line-up with existing holes on the equipment rack that are typically used to secure the equipment to the rack. Thus, suitable fasteners, such as screws, can be used to secure the rack accessory to the rack using the corresponding mounting holes in the rack accessory and the rack.

The rear support member 14 of the rack accessory 10 may also include similar mounting holes (22a, 22b and/or 24) for enabling the rear portion of the rack accessory to be secured to a rear portion of the rack, when the rack includes a rear portion. In other words, the rear support member 14 can be used to secure the rack to the rear portion of a four post rack, wherein two front and two rear rack posts or the like are provided on the rack in a box-like configuration. If no rear posts are provided in the rack, the rack can be installed such that only the front support member is secured to the rack. When only the front support member 12 is secured to the rack, is it preferable to secure the back portion of adjacent rack accessories together with a bar or the like to prevent the adjacent rack accessories 10 from moving relative to one another and to help maintain the rack accessories in their desired position.

Figure 2:
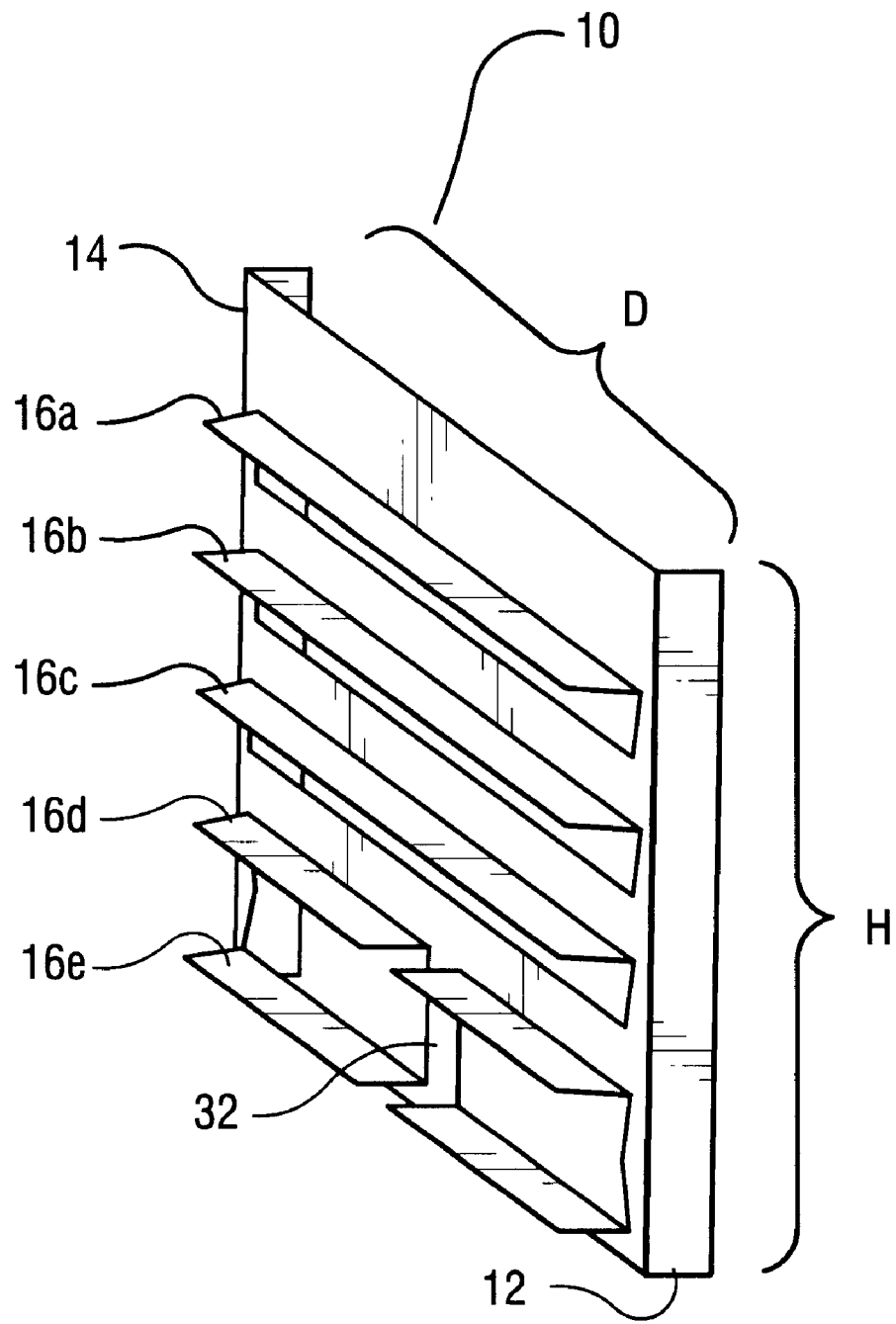
FIG. 2 is another perspective view of the preferred embodiment of the rack accessory of the instant invention.

FIG. 2 shows another view of a rack accessory 10 in accordance with the preferred embodiment of the instant invention. The mounting bracket defined by the front and/or rear support members (12,14) enable the rack accessory to fit neatly on a standard EIA/TIA 19 inch or 23 inch wide data rack, or other similarly sized data rack. The depth (D) of the rack accessory 10 can vary to fit different depth data racks and cabinets. The height (H) of the rack accessory 10 can also vary depending on the number of pieces of equipment that are desired to be supported in the rack accessory and/or how many rack accessories are desired to be installed in one vertical rack. In the exemplary embodiment of FIGS. 1 and 2, the rack accessory 10 includes five shelves, thereby enabling the rack accessory to support five pieces of equipment.

In accordance with this embodiment of the invention, the overall height (H) of the rack accessory 10 corresponds to a vertical distance on the rack itself that is designed to hold six pieces of equipment. As a result, in this example, the five pieces of equipment can be mounted in six rack units of space. Thus, assuming that the equipment height is one rack unit (1U=1.75 inches), the rack accessory is 10.5 inches in height and provides mounting space for five 1.75 inch tall pieces of equipment. Thus, in exchange for a 16.7% space efficiency decrease in the number of mounted servers, the servers (or other types of equipment) run cooler and without mechanical stress, and can be mounted and unmounted easily by a single technician.

Figure 3:
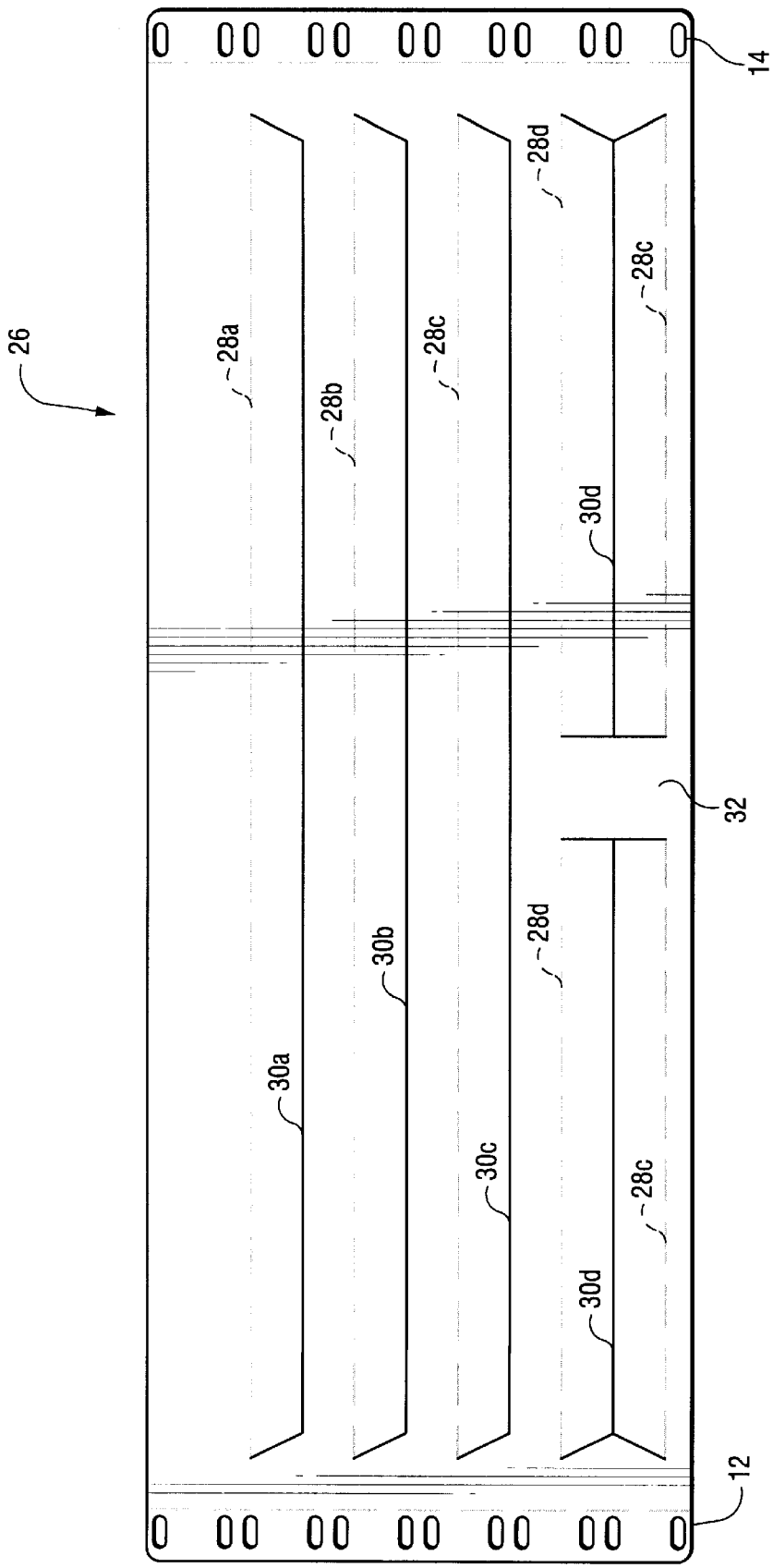
FIG. 3 is front plan view of a blank used to produce a preferred embodiment of the rack accessory of the instant invention.

FIG. 3 shows a plan view of a piece of sheet material or blank that can be used to construct the rack accessory shown in FIGS. 1 and 2. The sheet material or blank 26 is rectangular in shape and includes side portions 12 and 14 that are bent at 90 degrees to define the front and rear support members 12 and 14 of the rack accessory 10. The sheet also includes five fold lines 28a–28e and four cuts or punches 30a–30d that enable the shelves 16a–16e to be formed for the rack accessory 10 by folding the cut sections along the fold lines at an angle of 90 degrees. As can be seen in FIG. 3, the bottom cut line 30b is substantially shared by the two bottom shelves which are folded in opposite directions. This enables the bottom shelf 16e to be located near the bottom of the rack accessory 10. As can also be seen in FIG. 3, the bottom two shelves 16d and 16e are partitioned into two portions by an uncut portion 32. As a result, the uncut portion 32 defines a post 32 in the final rack accessory 10, as seen in FIGS. 1 and 2. This post feature is only optional, but it is useful in preventing equipment installed on the bottom shelf from sliding out the side of the rack when being installed, due to the difference in structure between the bottom shelf 16e and the other four shelves 16a–16d.

Figure 4B:
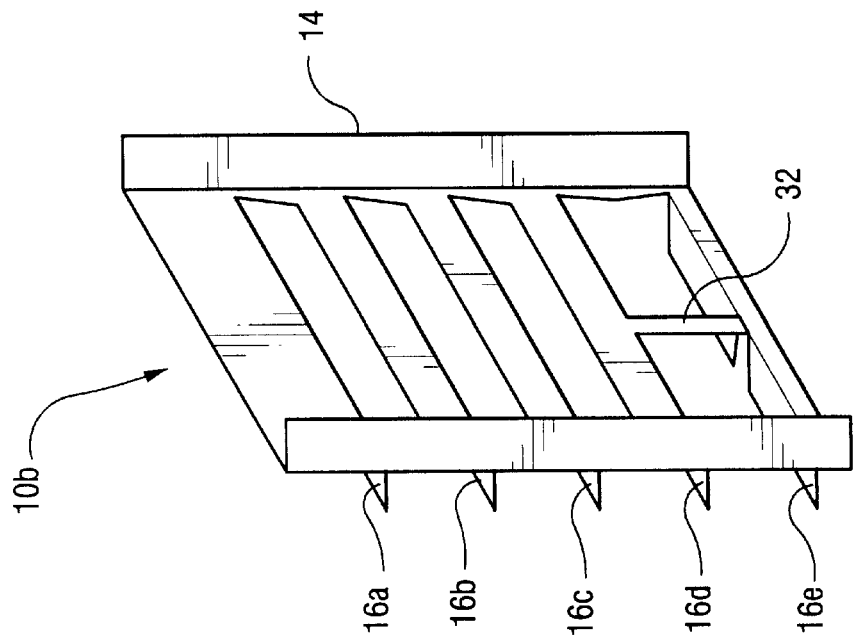
FIGS. 4A and 4B show a perspective view (front and back) of a typical pair of rack accessories in accordance with the preferred embodiment of the instant invention.
Figure 4A:
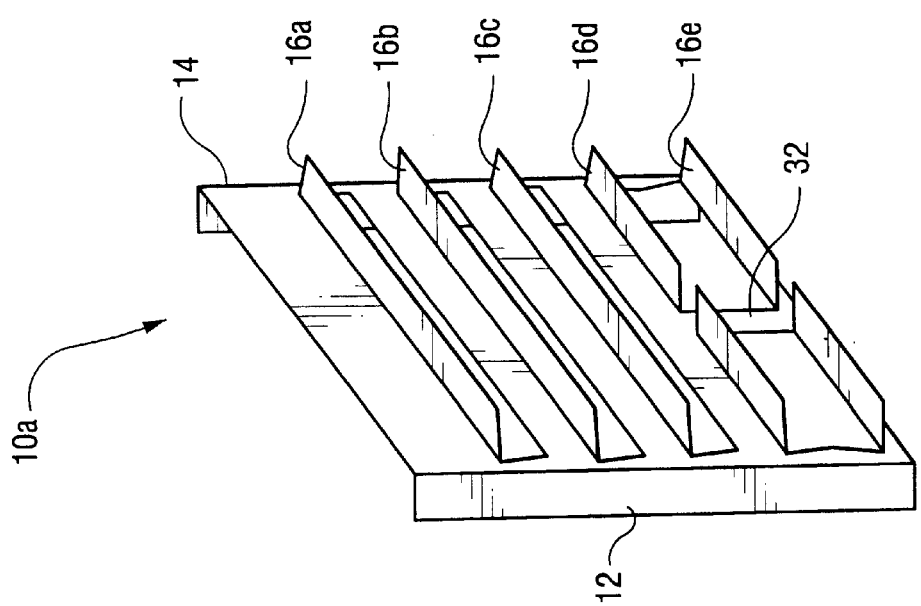

FIGS. 4A and 4B show a pair of rack accessories 10a and 10b constructed in accordance with the preferred embodiment of the invention. As can be seen in FIGS. 4A and 4B, a right hand 10b and left hand 10a embodiment are provided for enabling the pair 10a and 10b to be installed on opposite sides of the front portion (and possibly rear portion when existing) of a rack and at a corresponding height. Thus, a pair of complimentary rack accessories (e.g., 10a and 10b) are used in a single rack to provide support on both sides for equipment mounted in the rack at the location of the rack accessory.

Figure 5:
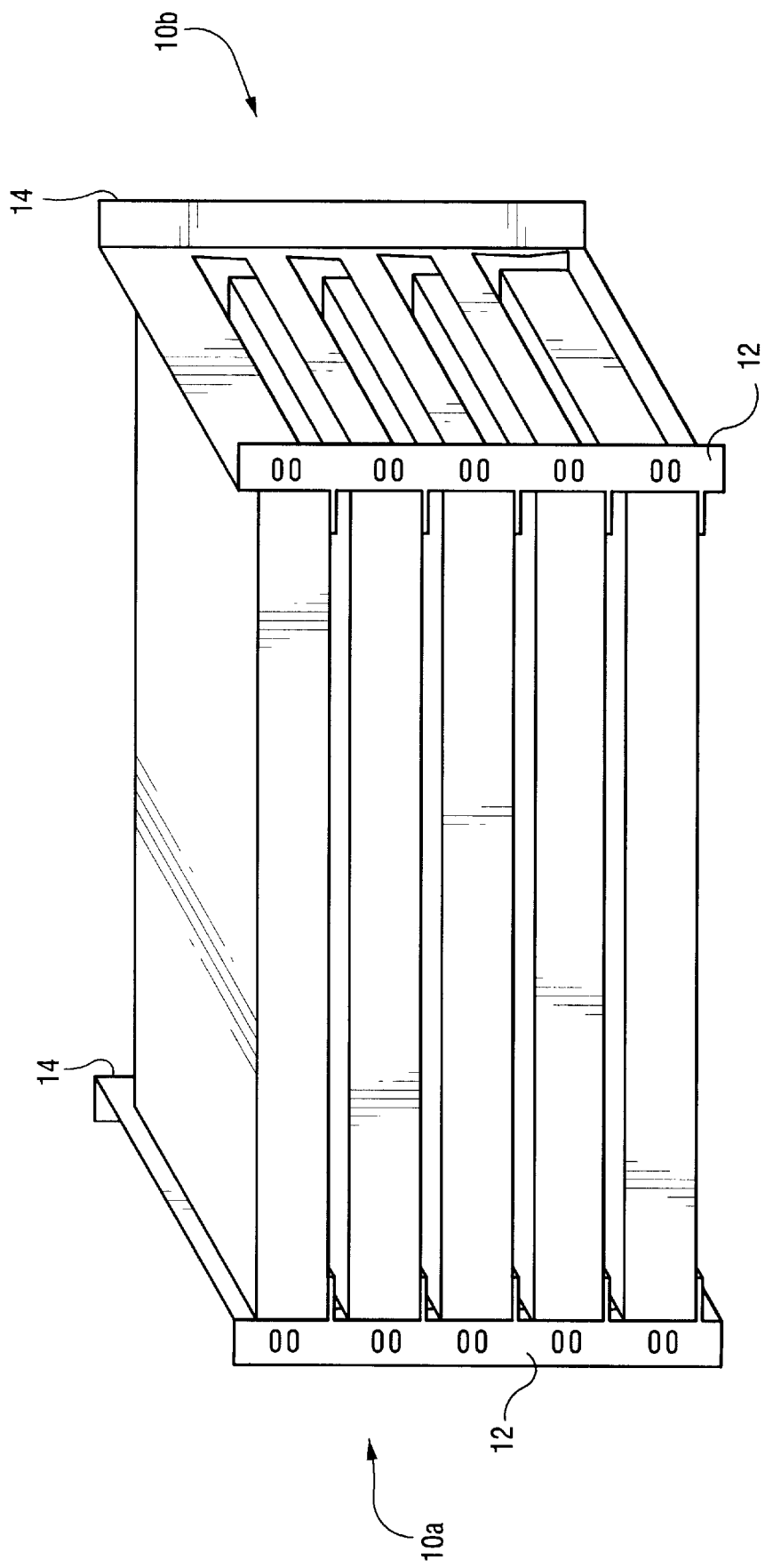
FIG. 5 shows the pair of rack accessories of FIG. 4 with five servers mounted therein.

FIG. 5 shows the rack accessory pair 10a and 10b of FIGS. 4A and 4B having five pieces of equipment (e.g., servers 1–5) installed therein, such that respective sides of each server are supported by respective shelves on the rack accessories 10a and 10b. One advantageous feature of the instant rack accessory is that the servers can be installed in the rack without the need to attach or mount the servers to the front rails of the rack or the rack accessory. Due to the shelves provided by the rack accessory, the servers can simply be slid into the slots defined by the rack accessory without the need to use fasteners or otherwise attach the equipment to the racks or the rack accessories. As a result, the servers can be easily and quickly slid in and out of the racks as desired. Of course, fasteners or other means of fastening the servers to the rack or the rack accessories may be used if desired. As an alternative to fasteners, a locking pin system (not shown) may be used on one or both sides of the rack accessory to prevent some or all of the servers from being pulled out of the rack. The locking pin system may be implemented by forming pin holders in the sides of the rack accessory that enable a long pin or bar to be slid therein and across the face of some or all of the servers in the vertical direction, thereby securing the servers in the rack.

Figure 6:
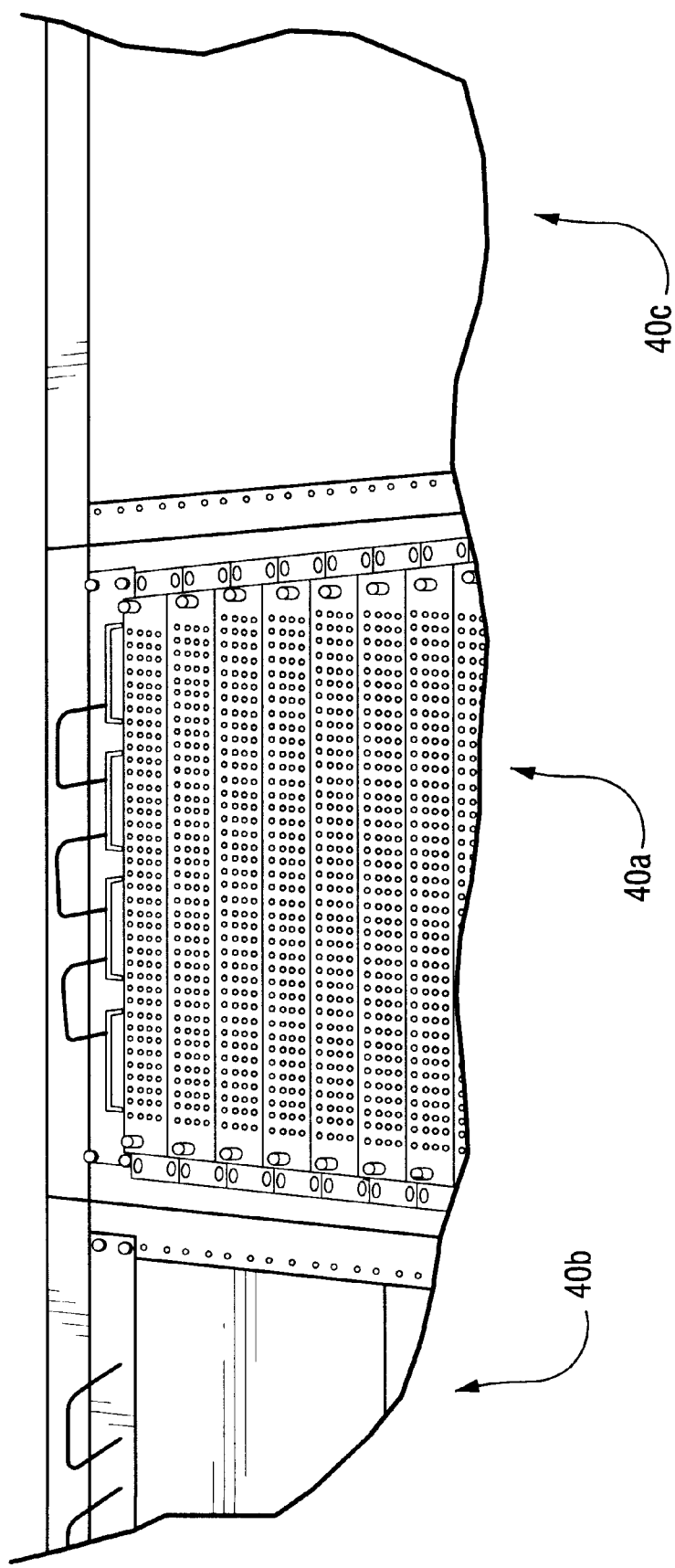
FIG. 6 shows a front view of an EIA-spec telecommunications racking system having several of the rack accessories of the instant invention installed therein and with several servers mounted in the rack accessories, in accordance with the instant invention.

FIG. 6 shows three rack systems 40a, 40b and 40c of the type to which the instant invention is directed. The center rack system is provided with three sets of rack accessories made in accordance with the preferred embodiment of the instant invention. The top two pairs of rack accessories are fully loaded with five servers each, while the lower pair of rack accessories have only two servers therein, thereby leaving three spaces for additional servers. As can be seen in FIG. 6, the rack accessories are secured to the existing racks, which in this embodiment are EIA/TIA-spec racks designed for 1U equipment, such as Web servers.

Figure 7:
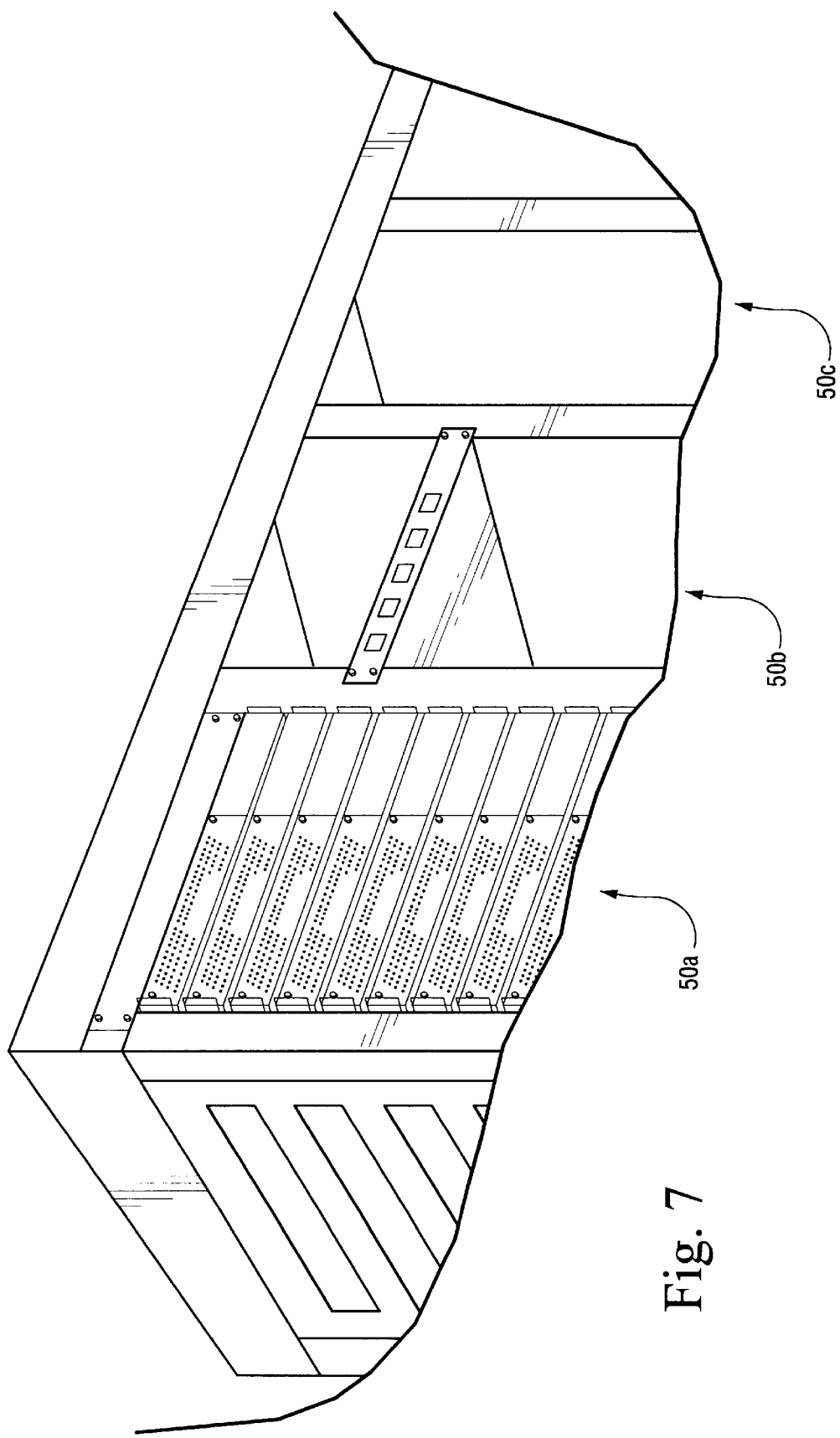
FIG. 7 shows a front/side view of an EIA-spec telecommunications racking system having several rack accessories of the instant invention installed therein and filled with servers.

FIG. 7 shows a series of existing EIA/TIA spec racks (50a, 50b and 50c), only one of which (50a) includes the rack accessories of the instant invention with servers installed therein. The other racks (50b and 50c) are shown without any rack accessories or servers therein. It is noted that, in accordance with the instant invention, the rack accessories may be provided on only a certain vertical portion of the rack, thereby leaving the remaining portion of the rack to be used in a conventional manner. Alternatively, a single rack accessory may extend the entire vertical height of the rack, thereby converting the entire rack with the rack accessory. In another embodiment, a plurality of rack accessories can be used to fill the entire rack.

Figure 8:
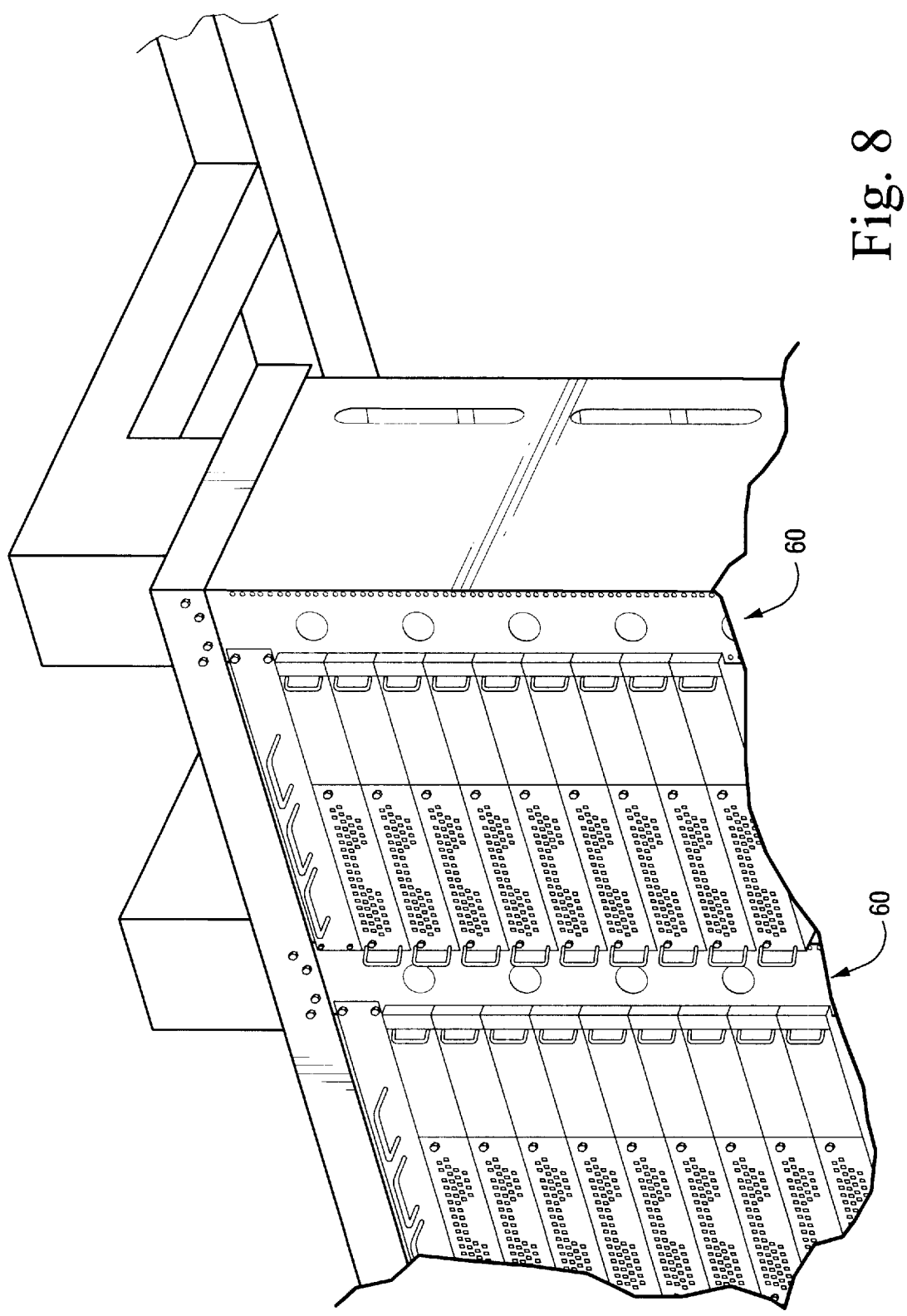
FIG. 8 shows a front/side view of an alternative EIA-spec racking system having several rack accessories of the instant invention installed therein and filled with servers.
Figure 9:
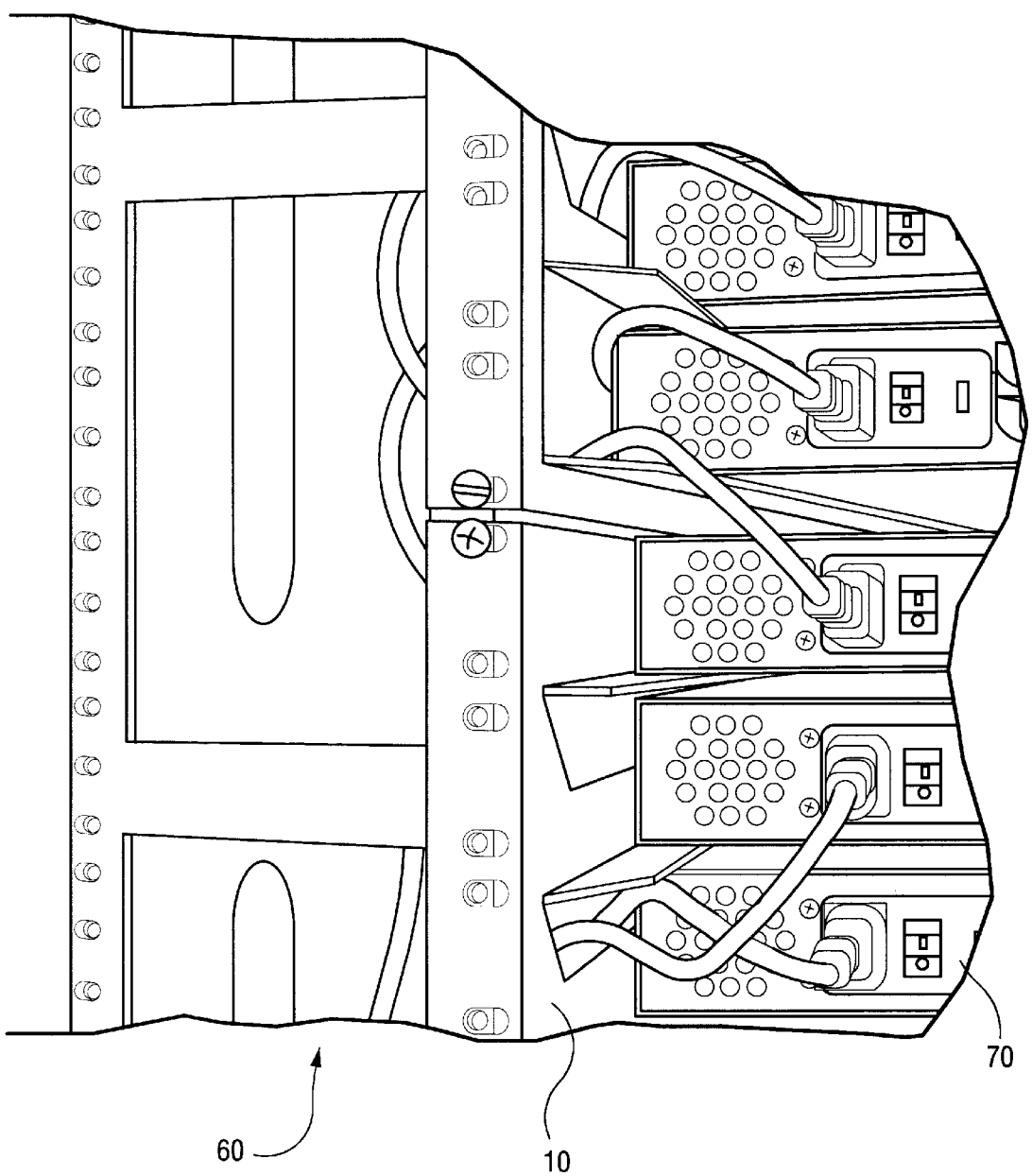
FIG. 9 shows a partial rear view of the racking system of FIG. 8 having the rack accessory of the instant invention installed therein and filled with servers.

FIG. 8 shows a front view of an alternative embodiment of EIA/TIA spec racks 60 on which the rack accessory 10 of the instant invention may be used. This alternative rack design is the subject of the co-pending application identified above by the same inventor as the instant application and which has been incorporated by reference herein. This alternative rack configuration includes an integral HVAC cooling system and power distribution system. FIG. 9 shows a back view of the rack system 60 of FIG. 8, having the rack accessories 10 and servers 70 mounted therein. The reader is directed to the related application for additional details regarding this alternative rack design 60. The instant rack accessory 10 of the present invention is used with this alternative rack 60 in substantially the same manner as described above with respect to the conventional rack designs of FIGS. 6 and 7.

As can be seen from the above description, the rack accessory of the instant invention provides at least the following benefits over conventional rack systems:

Introduction of small air gaps between densely mounted 1U (or other) equipment to enhance cooling with very little loss in overall space efficiency;

Full-length support of mounted equipment, which aids in the mounting and removal of equipment and maintains proper alignment (true horizontal) of equipment;

Elimination of the high moment in front-rail-only mounted equipment;

Inexpensive, reliable, efficient, and easy to manufacture;

Scaleable and easily adaptable to numerous applications where it is not desirable to maintain a strict correlation between rack units and equipment mounting points; and Allows for the placement of equipment into arbitrary vertical locations, without the need to, for example, alter conventional EIA spec racks with 1.75" vertical spacings for equipment As explained in detail above, the preferred embodiment of the invention includes a frame, n rack-units high (e.g., n*1.75 inches) which provides m pre-formed shelves for placing equipment. The number m will always be less than n, and the m shelves are preferably distributed evenly through the n unit-high mounting system. The frame is preferably mounted to the traditional EIA-spec rack, and provides shelves for placing equipment at intervals greater than 1.75 inches. The frame can be used with or without rear mounting rails. The shelves serve to distribute the moment of individual equipment across a larger vertical distance of the frame system in the case where no rear rails or support is provided.

The following is an example implementation of the invention:

EXAMPLE

Assumptions: n=6, m=5

Five pieces of 1U equipment (total=5*1.75=8.75 inches) can be mounted in six rack-units of space (total=6*1.75=10.5 inches), resulting in an air gap of 0.35 inches between each piece of equipment. In terms of total rack capacity, the efficiency of this exemplary system is 83%.

While the preferred forms and embodiments of the instant invention have been illustrated and described, various changes and modification may be made without deviating from the true scope of the invention as defined by the appended claims, as one skilled in the art will recognize from the description of the invention herein.

What is claimed is:

1. A method of mounting electronic equipment comprising:

providing an equipment rack, wherein said rack includes mounting locations for a predetermined number of units of electronic equipment within a predetermined vertical distance;

providing a first and second rack accessory, each rack accessory including:

a front support member and a rear support member, wherein said front support member defines a bracket adapted to be secured on a front mounting portion of said rack; and a predetermined number of substantially parallel and substantially equally spaced shelves extending between said front support member and said rear support member, wherein said shelves are each configured to support a side portion of a respective one of said units of electronic equipment when installed in said rack accessory;

wherein each said rack accessory has a height that substantially corresponds to said predetermined vertical distance, and said predetermined number of shelves is less than said predetermined number of units;

mounting said front support member of said first rack accessory on a first side of a front portion of said rack such that said shelves extend inwardly into the rack;

mounting said front support member of said second rack accessory on a second side of a front portion of said rack such that said shelves extend inwardly into the rack, and such that said second rack accessory substantially corresponds to a vertical location on said rack at which said first rack accessory is mounted, thereby defining a number of slots for mounting electronic equipment, wherein the number of slots is less than the predetermined number of units of electronic equipment for which the rack is designed to have mounted thereon within the predetermined vertical distance;

installing at least one piece of electronic equipment in the rack such that respective side portions of each of said at least one piece of said electronic equipment are supported on respective shelves of the first rack accessory and the second rack accessory.

2. The method of claim 1, further including installing a plurality of pieces of electronic equipment in the rack such that each shelf of each rack accessory supports a respective side portion of one of said plurality of pieces of electronic equipment.

3. The method of claim 1, wherein said predetermined number of units is six units, and the method further includes providing said first and second rack accessories such that said predetermined number of shelves is five shelves.

4. The method of claim 3, further including providing the first and second rack accessories such that the rack accessories are each approximately 10.5 inches high and are adapted for use with equipment that is 1.75 inches in height.

5. The method of claim 1, further including securing said rear support member of said first rack accessory on a first side of a rear portion of said rack, and securing said rear support member of said second rack accessory on a second side of a rear portion of said rack.

6. The method of claim 1, wherein the rack is an EIA-spec telecommunications rack, and installing at least one piece of equipment includes installing equipment that is one Rack Unit (1U) in height.

7. The method of claim 1, wherein the step of providing a first rack accessory includes forming said first rack accessory from a piece of sheet material that is cut and folded to define said front and rear support members and said shelves.

8. The method of claim 1, wherein mounting said front support member of each of said rack accessories includes using fasteners to secure each of said rack accessories to said rack.

* * * * *